United States Patent
Kim et al.

(10) Patent No.: US 9,413,371 B1
(45) Date of Patent: Aug. 9, 2016

(54) ADC AND ANALOG-TO-DIGITAL CONVERTING METHOD

(71) Applicant: SAMSUNG DISPLAY CO., LTD., Yongin, Gyeonggi-Do (KR)

(72) Inventors: Jeongkyoo Kim, Yongin (KR); Kyungyoul Min, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/791,720

(22) Filed: Jul. 6, 2015

(30) Foreign Application Priority Data

Jan. 28, 2015 (KR) .................. 10-2015-0013547

(51) Int. Cl.
*H03M 1/00* (2006.01)
*H03M 1/12* (2006.01)
*H03M 1/44* (2006.01)

(52) U.S. Cl.
CPC ............ *H03M 1/002* (2013.01); *H03M 1/1245* (2013.01); *H03M 1/44* (2013.01)

(58) Field of Classification Search
CPC ......... H03M 1/44; H03M 1/12; H03M 1/002; H03M 1/56; H03M 1/02; H03M 1/1245
USPC ......................................... 341/155, 122, 156
See application file for complete search history.

(56) References Cited

U.S. PATENT DOCUMENTS

| 8,344,931 | B2 * | 1/2013 | Zhu ...................... | H03M 1/002 341/155 |
| 2005/0231412 | A1 * | 10/2005 | Confalonieri ......... | H03M 1/002 341/155 |
| 2009/0128386 | A1 * | 5/2009 | Meynants ............... | H03M 1/14 341/144 |
| 2011/0102219 | A1 | 5/2011 | Jeong et al. | |
| 2012/0306679 | A1 * | 12/2012 | Zhu ...................... | H03M 1/002 341/155 |
| 2014/0327800 | A1 | 11/2014 | Sugawa | |

FOREIGN PATENT DOCUMENTS

| KR | 10-1997-0013785 A | 3/1997 |
| KR | 10-2011-0048231 A | 5/2011 |
| KR | 10-2014-0021093 A | 2/2014 |
| KR | 10-2014-0093262 A | 7/2014 |

* cited by examiner

*Primary Examiner* — Jean B Jeanglaude
(74) *Attorney, Agent, or Firm* — Lee & Morse, P.C.

(57) ABSTRACT

An analog-to-digital converter includes a successive approximation converter, a voltage comparator, and a controller. The successive approximation converter receives an analog input voltage and a first reference voltage, determines the level of a voltage of a first node as a negative level of the analog input voltage, and using a successive approximation method determines an output logic value corresponding to one bit of the N-bit output digital code at every one successive approximation cycle while adjusting the level of the voltage of the first node based on a level of the first reference voltage. The voltage comparator compares the level of the voltage of the first node with a level of a second reference voltage to generate a comparison logic value. When the output logic value or the comparison logic value satisfies a condition, the controller terminates conversion and determines the N-bit output digital code.

21 Claims, 4 Drawing Sheets

ADC AND ANALOG-TO-DIGITAL CONVERTING METHOD

CROSS-REFERENCE TO RELATED APPLICATION

Korean Patent Application No. 10-2015-0013547, filed on Jan. 28, 2015, and entitled, "ADC and Analog-to-Digital Converting Method," is incorporated by reference herein in its entirety.

BACKGROUND

1. Field

One or more embodiments herein relate to an analog-to-digital converter and an analog-to-digital converting method.

2. Description of the Related Art

Many electronic devices use digital circuits. In order for the digital circuits to operate, analog signals must be converted to digital signals so that proper processing may take place. One type of analog-to-digital converter (ADC) generates digital signals using a successive approximation register (SAR). This type of converter occupies a relatively small area and is low in power consumption, and thus is suitable for use in multimedia players, notebook computers, and other types of portable electronic devices.

In operation, the SAR ADC may determine one bit for every successive approximation cycle. Therefore, an N-time bit determination operation based on an N-time successive approximation cycle may be performed to obtain an N-bit digital signal from an analog signal. However, signal conversion by the SAR ADC requires a conversion time that is linearly proportional to the resolution of a digital signal obtained as a result of the conversion.

SUMMARY

In accordance with one or more embodiments, an analog-to-digital converter includes a converter to receive an analog input voltage and a first reference voltage, to determine a level of a voltage of a first node as a negative level of the analog input voltage through a sampling and holding operation, and to determine output logic values using a successive approximation method, each output logic value corresponding to a respective bit of an N-bit output digital code to be determined for each of a plurality of successive approximation cycles, the level of the voltage of the first node to be adjusted based on a level of the first reference voltage during the successive approximation method; a voltage comparator to compare the level of the voltage of the first node with a level of a second reference voltage to generate a comparison logic value; and a controller to terminate an analog-to-digital conversion operation based on the successive approximation method and to determine the N-bit output digital code when the output logic value or the comparison logic value satisfies a certain condition.

When the level of the voltage of the first node has a positive value, the output logic value may be determined as 1, when the level of the voltage of the first node has a negative value, the output logic value may be determined as 0, when the level of the voltage of the first node is higher than the level of the second reference voltage, the comparison logic value may be determined as 1, and when the level of the voltage of the first node is lower than the level of the second reference voltage, the comparison logic value may be determined as 0.

The certain condition may include at least one of the comparison logic value is 1 when the output logic value is 0, or the comparison logic value is 0 when the output logic value is 1.

When the output logic value is 0, the controller may determine a value of a bit corresponding to the output logic value as 1, when the output logic value is 1, the controller may determine the value of the bit corresponding to the output logic value as 0, when the certain condition is satisfied when the output logic value is 0 and the comparison logic value is 1, the controller may determine, as 0, all values of bits lower than the bit corresponding to the output logic value among digital values of the N-bit output digital code, and when the certain condition is satisfied when the output logic value is 1 and the comparison logic value is 0, the controller may determine, as 1, all the values of the bits lower than the bit corresponding to the output logic value among the digital values of the N-bit output digital code.

The analog-to-digital converter may include a switch to electrically connect the voltage comparator to the first node, wherein the switch may be short-circuited between a time when the output logic value corresponding to one bit of the N-bit digital output digital code is determined through one successive approximation cycle and a time when a next successive approximation cycle starts.

The voltage comparator may include a first voltage comparator to compare the level of the voltage of the first node with the level of the second reference voltage to generate a first comparison logic value; and a second voltage comparator to compare the level of the voltage of the first node with a level of a third reference voltage to generate a second comparison logic value. The second reference voltage and the third reference voltage may have substantially equal levels and opposite polarities.

When the level of the voltage of the first node has a positive value, the output logic value may be determined as 1, when the level of the voltage of the first node has a negative value, the output logic value may be determined as 0, when the level of the voltage of the first node is higher than the level of the second reference voltage, the first voltage comparator may determine the first comparison logic value as 1, when the level of the voltage of the first node is lower than the level of the second reference voltage, the first voltage comparator may determine the first comparison logic value as 0, when the level of the voltage of the first node is higher than the level of the third reference voltage, the second voltage comparator may determine the second comparison logic value as 0, and when the level of the voltage of the first node is lower than the level of the third reference voltage, the second voltage comparator may determine the second comparison logic value as 1.

The certain condition may include the first and second comparison logic values are 1, or all the first and second comparison logic values are 0.

When the output logic value is 0, the controller may determine a value of a bit, corresponding to the output logic value as 1, when the output logic value is 1, the controller may determine the value of the bit, corresponding to the output logic value, as 0, when the certain condition is satisfied and the output logic value is 0, the controller may determine, as 0, all values of bits lower than the bit corresponding to the output logic value among digital values of the N-bit output digital code, and when the certain condition is satisfied and the output logic value is 1, the controller may determine, as 1, all the values of the bits lower than the bit corresponding to the output logic value among the digital values of the N-bit output digital code.

The analog-to-digital converter may include a first switch to connect the first voltage comparator to the first node; and a second switch to connect the second voltage comparator to the first node, wherein the first and second switches are to be short-circuited between a time when the output logic value corresponding to one bit of the N-bit digital output digital code is determined through one successive approximation cycle and a time when a next successive approximation cycle starts.

In accordance with one or more other embodiments, an analog-to-digital converting method includes receiving an analog input voltage and a first reference voltage, determining a level of a voltage of a first node as a negative level of the analog input voltage through a sampling and holding operation; determining output logic values corresponding to respective bits of an N-bit output digital code, each output logic value determined during one of a plurality of successive approximation cycles using a successive approximation method while adjusting the level of the voltage of the first node based on a level of the first reference voltage; comparing the level of the voltage of the first node with a level of a second reference voltage to generate a comparison logic value; determining whether the output logic value and the comparison logic value satisfy a certain condition; and when the certain condition is satisfied, terminating an analog-to-digital conversion operation and determining the N-bit output digital code.

Determining the output logic value may include when the level of the voltage of the first node has a positive value, determining the output logic value as 1; when the level of the voltage of the first node has a negative value, determining the output logic value as 0; when the level of the voltage of the first node is higher than the level of the second reference voltage, determining the comparison logic value as 1; and when the level of the voltage of the first node is lower than the level of the second reference voltage, determining the comparison logic value as 0.

The certain condition may include at least one of the comparison logic value is 1 when the output logic value is 0, or the comparison logic value is 0 when the output logic value is 1.

Determining the output digital code may include when the output logic value is 0, determining a value of a bit, corresponding to the output logic value, as 1; when the output logic value is 1, determining the value of the bit, corresponding to the output logic value, as 0; when the certain condition is satisfied as a case in which the output logic value is 0 and the comparison logic value is 1, determining, as 0, all values of bits lower than the bit corresponding to the output logic value among digital values of the N-bit output digital code; and when the certain condition is satisfied as a case in which the output logic value is 1 and the comparison logic value is 0, determining, as 1, all the values of the bits lower than the bit corresponding to the output logic value among the digital values of the N-bit output digital code.

Generating the comparison logic value may include comparing the level of the voltage of the first node with the level of the second reference voltage to generate a first comparison logic value; and comparing the level of the voltage of the first node with a level of a third reference voltage to generate a second comparison logic value. The second reference voltage and the third reference voltage may have substantially equal levels and opposite polarities.

Determining the output logic value may include when the level of the voltage of the first node has a positive value, determining the output logic value as 1; when the level of the voltage of the first node has a negative value, determining the output logic value as 0; when the level of the voltage of the first node is higher than the level of the second reference voltage, determining the first comparison logic value as 1; when the level of the voltage of the first node is lower than the level of the second reference voltage, determining the first comparison logic value as 0; when the level of the voltage of the first node is higher than the level of the third reference voltage, determining the second comparison logic value as 0; and when the level of the voltage of the first node is lower than the level of the third reference voltage, determining the second comparison logic value as 1.

The certain condition may include the first and second comparison logic values are 1, or the first and second comparison logic values are 0.

Determining the output digital code may include when the output logic value is 0, determining a value of a bit, corresponding to the output logic value, as 1; when the output logic value is 1, determining the value of the bit, corresponding to the output logic value, as 0; when the certain condition is satisfied and the output logic value is 0, determining, as 0, all values of bits lower than the bit corresponding to the output logic value among digital values of the N-bit output digital code; and when the certain condition is satisfied and the output logic value is 1, determining, as 1, all the values of the bits lower than the bit corresponding to the output logic value of the digital values of the N-bit output digital code.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
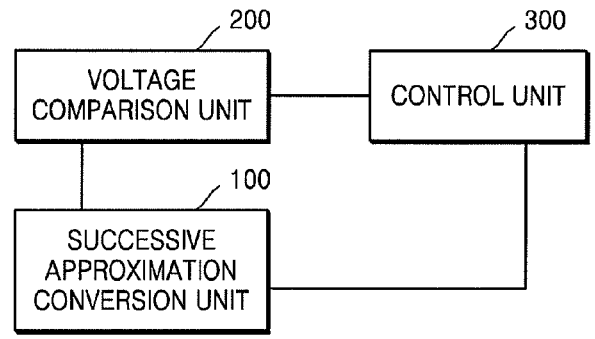
FIG. 1 illustrates an embodiment of an analog-to-digital converter.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments. Like reference numerals refer to like elements throughout.

FIG. 1 an embodiment of an analog-to-digital converter which includes a successive approximation conversion unit 100, a voltage comparison unit 200, and a control unit 300.

The successive approximation conversion unit 100 receives an analog input voltage and a first reference voltage and converts the analog input voltage to an output digital code based on a level of the first reference voltage. The successive approximation conversion unit 100 sequentially determines values from a first predetermined bit (e.g., a most significant bit (MSB)) to a second predetermined bit (e.g., a least significant bit (LSB)) of the output digital code to determine the output digital code approximated to the analog input voltage. The successive approximation conversion unit 100 may convert the analog input voltage to the output digital code through a plurality of successive approximation cycles. The successive approximation conversion unit 100 may determine an output logic value corresponding to one bit of the output digital code at every one successive approximation cycle. The determined output logic value may then be output to the control unit 300.

In one embodiment, the successive approximation conversion unit 100 converts the analog input voltage to an N-bit output digital code. The successive approximation conversion unit 100 includes an N-bit digital-to-analog converter, a first comparator, and a plurality of switching elements that generate an output voltage of the digital-to-analog converter. The N-bit digital-to-analog converter may include an array of N+1 number of capacitive elements.

The voltage comparison unit 200 compares the level of an output voltage of the digital-to-analog converter of the successive conversion unit 100 with the level of a second reference voltage. The voltage comparison unit 200 generates a comparison logic value based on a comparison result. The voltage comparison unit 200 may output the comparison logic value to the control unit 300.

The control unit 300 controls the ADC. For example, the control unit 300 may control the timing when the switching elements in the successive approximation conversion unit 100 are opened or short-circuited, to thereby control the output voltage of the digital-to-analog converter. Also, the control unit 300 may control the level of the first reference voltage supplied to the successive approximation conversion unit 100 or the level of the second reference voltage supplied to the voltage comparison unit 200.

The control unit 300 may receive an output logic value or a comparison logic value. The control unit 300 may determine a digital value corresponding to the output logic value. The control unit 300 may include a successive approximation register that stores a plurality of digital values determined by the control unit 300. The control unit 300 may arrange the determined digital values to generate an output digital code. The successive approximation register may be in the control unit 300 or the successive approximation conversion unit 100.

The control unit 300 checks whether the output logic value or the comparison logic value satisfies a certain condition. When the output logic value or the comparison logic value satisfies the certain condition, the control unit 300 may terminate an analog-to-digital conversion operation performed by the successive approximation conversion unit 100 and determine an N-bit output digital code. For example, when the output logic value or the comparison logic value satisfies the certain condition while the successive approximation conversion unit 100 repeats an operation of determining an output logic value corresponding to one bit of the output digital code at every one successive approximation cycle, the control unit 300 may stop the operation of determining the output logic value through a successive approximation cycle and determine the N-bit output digital code corresponding to the analog input voltage. In this case, values determined based on the output logic value of the successive approximation conversion unit 100 among bit values of the output digital code may be maintained as-is, e.g., without change.

Figure 2:
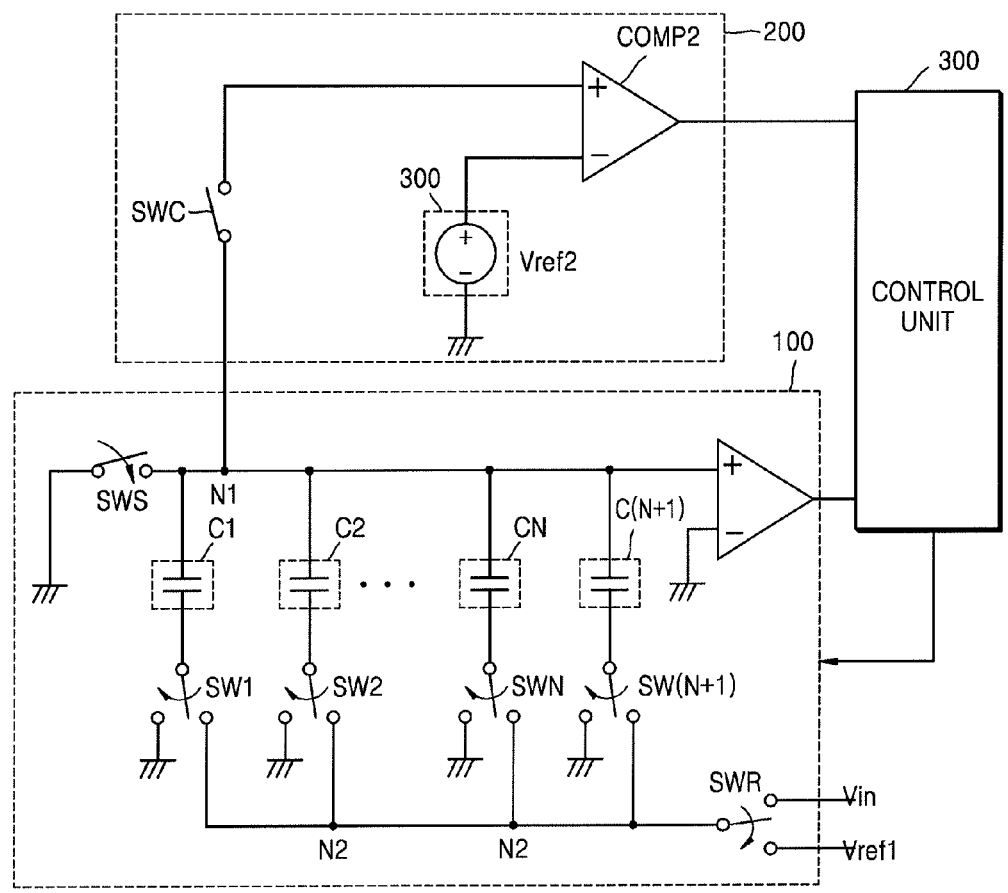
FIGS. 2 to 4 illustrate example embodiments of the analog-to-digital converter.
Figure 3:
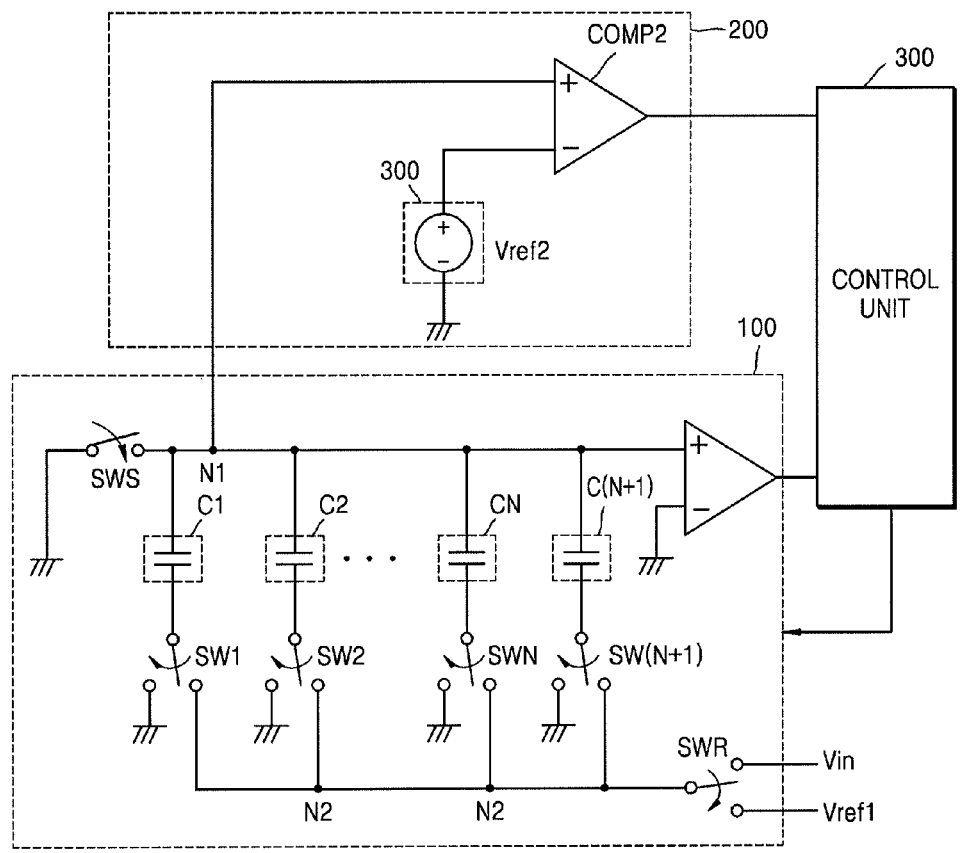
Figure 4:
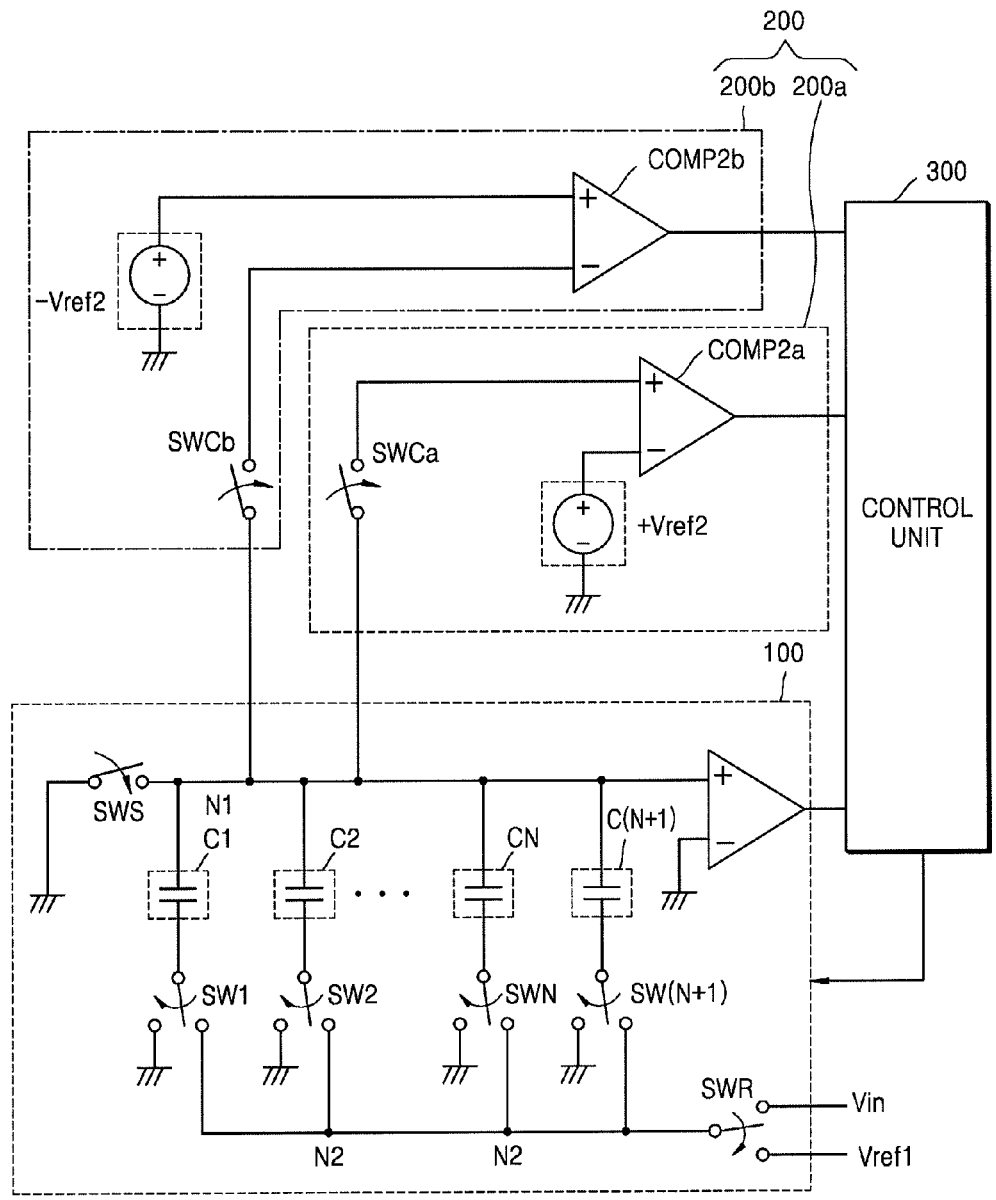

FIGS. 2 to 4 illustrate various circuit embodiments of the ADC in FIG. 1.

Referring to FIG. 2, the ADC of FIG. 1 includes the successive approximation conversion unit 100, the voltage comparison unit 200, and the control unit 300. Also, the voltage comparison unit 200 includes a comparison switch SWC to electrically connect the successive approximation conversion unit 100 to the voltage comparison unit 200.

The successive approximation conversion unit 100 includes an array of N+1 number of capacitive elements C1 to C(N+1), a first comparator COMP1, a sampling switch SWS, a reference switch SWR, and N+1 number of redistribution switches SW1 to SW(N+1) that perform a redistribution operation. In the array of the N+1 capacitive elements C1 to C(N+1), the capacitive elements C1 to C(N+1) may be capacitive elements having different binary weight values. For example, in the array of the N+1 capacitive elements C1 to C(N+1), the capacitance of a capacitive element corresponding to a certain bit of an output digital code may be two times a capacitance of a capacitive element corresponding to a lower bit adjacent to a corresponding bit.

For example, the N+1 capacitive elements C1 to C(N+1) may respectively have capacitances of $2^{(N-1)}C$, $2^{(N-2)}C$, ..., $2^1C$, and $2^0$ C. One end of the array of the N+1 capacitive elements C1 to C(N+1) may be connected to a first node N1. When the sampling switch SWS is short-circuited, the first node N1 may have a ground level, and thus, one end of each of the capacitive elements C1 to C(N+1) may be grounded. The other ends of the capacitive elements C1 to C(N+1) may be connected to the N+1 redistribution switches SW1 to SW(N+1) to selectively connect the capacitive elements C1 to C(N+1) to a reference voltage (e.g., ground) or a second node N2, respectively.

Each of the N+1 redistribution switches SW1 to SW(N+1) may connect a capacitive element, connected to a corresponding switch, to the ground or the second node N2 according to a control signal from the control unit 300. The control signal input to the N+1 redistribution switches SW1 to SW(N+1), as described below, may correspond to each bit of an N-bit output digital code corresponding to an analog input voltage.

A non-inverting terminal (+) of the first comparator COMP1 may be connected to the first node N1, and an inverting terminal (−) of the first comparator COMP1 may be connected to the ground. The first comparator COMP1 may compare a voltage of the first node N1, which is an output voltage of the array of the capacitive elements C1 to C(N+1), with a zero-level voltage (0 V) of the ground to output an output logic value as 1 or 0. For example, when the voltage of the first node N1 is higher than 0 V, the first comparator COMP1 may output the output logic value as 1. When the voltage of the first node N1 is equal to or lower than 0 V, the first comparator COMP1 may output the output logic value as 0.

The successive approximation conversion unit 100 may perform a conversion operation via three stages, e.g., a sampling stage, a holding stage, and a redistribution stage. The stages may be controlled based on the controls signal from control unit 300.

In the sampling stage, the successive approximation conversion unit 100 may connect the reference switch SWR to an analog input voltage Vin, connect the sampling switch SWS to the ground, and connect the redistribution switches SW1 to SW(N+1) to the second node N2 in order for the redistribution switches SW1 to SW(N+1) to be connected to the reference switch SWR. Therefore, in the sampling stage, the successive approximation conversion unit 100 may perform a sampling operation of storing the analog input voltage Vin in the capacitive elements C1 to C(N+1) in the array of the capacitive elements C1 to C(N+1).

Subsequently, in the holding stage, the successive approximation conversion unit 100 may open the sampling switch SWS and connect the redistribution switches SW1 to SW(N+1) to the ground. Therefore, the successive approximation conversion unit 100 may perform a holding operation, which changes a level of a voltage of the first node N1 to an inversion value (e.g., −Vin) of an analog input signal, without a change in the analog input voltage Vin stored in the capacitive elements C1 to C(N+1) in the array of the capacitive elements C1 to C(N+1). Subsequently, the successive approximation conversion unit 100 may connect the reference switch SWR to a first reference voltage Vref1.

Subsequently, in the redistribution stage, the successive approximation conversion unit 100 may connect the redistribution switch SW1 connected to the capacitive element C1 corresponding to an MSB, to the second node N2 in order for the redistribution switch SW1 to be connected to the reference switch SWR. In this case, the first reference voltage Vref1 is distributed based on a capacitance of the capacitive element C1. Therefore, the level of the voltage of the first node N1 may be expressed by Equation (1).

$$-Vin + \frac{1}{2}Vref1 \qquad (1)$$

When the level of the voltage of the first node N1 is higher than 0 V, the first comparator COMP1 may output the output logic value as 1. The control unit 300 may receive the output logic value. When the output logic value of the first comparator COMP1 is 1, a level of the analog input voltage Vin may be lower than ½ of the first reference voltage Vref1. Therefore, the control unit 300 may determine, as 0, a MSB of an N-bit output digital code corresponding to the analog input signal.

In this case, the successive approximation conversion unit 100 may again connect the redistribution switch SW1, connected to the capacitive element C1 corresponding to the MSB, to the ground. For example, when the level of the voltage of the first node N1 is lower than 0 V, the first comparator COMP1 may output the output logic value as 0. When the output logic value of the first comparator COMP1 is 0, the level of the analog input voltage Vin may be higher than ½ of the first reference voltage Vref1. Therefore, the control unit 300 may determine, as 1, the MSB of the N-bit output digital code corresponding to the analog input signal. In this case, the successive approximation conversion unit 100 may connect the redistribution switch SW1, connected to the capacitive element C1 corresponding to the MSB, to the second node N2 as-is. Therefore, the successive approximation conversion unit 100 may determine the MSB of the N-bit output digital code and determine a position which is to be connected to the redistribution switch SW1, based on a result of the determination.

The successive approximation conversion unit 100 may repeat the redistribution operation and may repeatedly output an output logic value. The control unit 300 may repeatedly perform the operation of determining a value of a bit corresponding to the output logic value, to thereby approximate the N-bit output digital code. When the output logic value of the first comparator COMP1 corresponding to a kth-position bit of the N-bit output digital code is 0, the control unit 300 may determine the value of a corresponding bit as 1. When the output logic value of the first comparator COMP1 corresponding to the kth-position bit of the N-bit output digital code is 1, the control unit 300 may determine the value of the corresponding bit as 0.

In this case, the operation of performing a one-time redistribution stage may be referred to as a successive approximation cycle. The successive approximation conversion unit 100 may repeat the successive approximation cycle until a LSB of the N-bit output digital code is determined. For example, the successive approximation conversion unit 100 may repeat the successive approximation cycle N times, and thus may output an output logic value N times until the N-bit output digital code is determined.

A method for calculating an approximation value of the output digital code corresponding to the analog input signal by performing a plurality of redistribution operations may be referred to as a successive approximation method. When converting an analog input voltage into the N-bit output digital code, the successive approximation conversion unit 100 may repeat an operation, which changes and compares the level of the voltage of the first node N1, during N cycles, and thus may determine an output digital value which is sequentially approximated from the MSB of the N-bit output digital code to the analog input signal. For example, the level of the voltage of the first node N1 may correspond to a conversion error, and as approximation by the successive approximation method is performed, the level of the voltage of the first node N1 is lowered to thereby decrease the error.

In one embodiment, a final operation performed in the holding stage to connect the reference switch SWR to the first reference voltage Vref1 may be performed as a first operation of the holding stage, or may be performed as a final operation of the redistribution stage. However, where the operation is performed as the final operation of the redistribution stage, when the redistribution stage is repeated several times, the operation may be performed only once in a first redistribution stage.

In the present embodiment, the sampling stage, the holding stage, and the redistribution stage are separate stages. In another embodiment, one or more of the stages may be merged into a same stage.

The voltage comparison unit 200 includes a second comparator COMP2 and a comparison switch SWC. The voltage comparison unit 200 includes a voltage source that generates a second reference voltage Vref2 which serves as a reference for voltage comparison. In another embodiment, the voltage comparison unit 200 may receive the second reference voltage Vref2 from an external source. The voltage comparison unit 200 outputs a comparison logic value to the control unit 300.

A non-inverting terminal (+) of the second comparator COMP2 may be connected to the first node N1, and an inverting terminal (−) of the second comparator COMP2 may be connected to a terminal that supplies the second reference voltage Vref2. When the level of the voltage of the first node N1 is higher than that of the second reference voltage Vref2, the second comparator COMP2 may output the comparison logic value as 1. When the level of the voltage of the first node N1 is lower than that of the second reference voltage Vref2, the second comparator COMP2 may output the comparison logic value as 0.

The non-inverting terminal (+) of the second comparator COMP2 may be connected to the first node N1 through the comparison switch SWC. For example, when the comparison switch SWC is short-circuited, the non-inverting terminal (+) of the second comparator COMP2 may be connected to the first node N1. When the comparison switch SWC is opened, the non-inverting terminal (+) of the second comparator COMP2 may be floated.

The voltage comparison unit 200 may short-circuit the comparison switch SWC between a time when an output logic value corresponding to one bit of an N-bit digital output digital code is determined through one successive approximation cycle and a time when a next successive approximation cycle starts. For the other time, the voltage comparison unit 200 may open the comparison switch SWC. For example, at a time when one output logic value is determined through one successive approximation cycle, the voltage comparison unit 200 may generate the comparison logic value using the voltage of the first node N1 which is used to determine the output logic value. Therefore, the voltage comparison unit 200 may output the comparison logic value, corresponding to the output logic value, to the control unit 300, at a time when the successive approximation conversion unit 100 determines the output logic value.

The control unit 300 may receive the output logic value and the comparison logic value. When the received output logic value or the received comparison logic value satisfies a certain condition, the control unit 300 may terminate an analog-to-digital conversion operation based on the successive approximation method and determine the N-bit output digital code. For example, it may be assumed that an output logic value or a comparison logic value, which is output when k (which is less than N) successive approximation cycles have been performed, satisfies the certain condition while the analog-to-digital conversion operation based on the successive approximation method is being performed. In this case, the control unit 300 may terminate the successive approximation method, and maintain k bits (obtained from k output logic values output from the successive approximation conversion unit 100) as k bit values of the N-bit output digital code. Also, the control unit 300 may determine the other N-k bit values based on the certain condition, thereby converting the analog input signal to the N-bit output digital code.

The certain condition may be, for example, whether the comparison logic value is 0 when the output logic value is 1. In this case, the second reference voltage Vref2 may be a positive value. Also, the level of the second reference voltage Vref2 may be a level equal to or a little lower than the level of a voltage corresponding to a minimum grayscale value of the N-bit output digital code. For example, the level of the voltage of the first node N1 may be a positive number. Thus, when the output logic value is determined as 1 the certain condition may be satisfied when the comparison logic value is determined as 0. This is because the level of the voltage of the first node N1 is lower than the second reference voltage Vref2, which is a positive value having a relatively low level. In this case, the control unit 300 may determine, as 0, the value of a bit corresponding to a current output logic value among bits of the N-bit output digital code, and may determine, as 1, all values of bits lower than a corresponding bit. As a result, when the value of a current bit is determined as 0 instead of 1 due to a fine difference of a level of the analog input voltage, the control unit 300 may determine, as 1, bits lower than a corresponding bit. Thus, the analog-to-digital conversion operation is quickly completed in a state where error of an output digital value is relatively small.

The certain condition may be whether the comparison logic value is 1 when the output logic value is 0. In this case, the second reference voltage Vref2 may be a negative value. Also, the level of the second reference voltage Vref2 may be a level equal to or a little lower than a level of a voltage corresponding to an inversion value of a minimum grayscale value of the N-bit output digital code. For example, the level of the voltage of the first node N1 may be a negative number. Thus, when the output logic value is determined as 0, the certain condition may be satisfied when the comparison logic value is determined as 0. This is because the level of the voltage of the first node N1 is higher than the second reference voltage Vref2, which is a negative value having a relatively low level.

In this case, the control unit 300 may determine, as 1, the value of a bit corresponding to a current output logic value among bits of the N-bit output digital code, and may determine, as 1, all values of bits lower than a corresponding bit. As a result, when a value of a current bit is determined as 1 instead of 0 due to a fine difference of a level of the analog input voltage, the control unit 300 may determine, as 0, bits lower than a corresponding bit. Thus, the analog-to-digital conversion operation is quickly completed in a state where error of an output digital value is relatively small.

Referring to FIG. 3, the ADC of FIG. 1 may include the successive approximation conversion unit 100, the voltage comparison unit 200, and the control unit 300. In this embodiment, some elements are changed compared to the embodiment of FIG. 2, as described below.

The non-inverting terminal (+) of the second comparator COMP2 is directly connected to the first node N1. For example, unlike FIG. 2, the comparison switch SWC, that electrically connects the non-inverting terminal (+) of the second comparator COMP2 to the first node N1, may be omitted. In this case, the control unit 300 may check whether a comparison logic value and an output logic value satisfy a certain condition, between a time when an output logic value corresponding to one bit of an N-bit digital output digital code is determined through one successive approximation cycle and a time when a next successive approximation cycle starts. Therefore, the control unit 300 may check whether a corresponding output logic value and the comparison logic value satisfy the certain condition at a time when the successive approximation conversion unit 100 determines the output logic value.

Referring to FIG. 4, the ADC of FIG. 1 includes the successive approximation conversion unit 100, the voltage comparison unit 200, and the control unit 300. Also, the voltage comparison unit 200 may include a first voltage comparison unit 200a and a second voltage comparison unit 200b. In the embodiment of FIG. 4, some elements are changed compared to the exemplary embodiment of FIG. 2, as described below.

The first voltage comparison unit 200a includes a second comparator COMP2a and a first comparison switch SWCa. The first voltage comparison unit 200a may include a voltage source that generates a second reference voltage +Vref2 which is a reference for voltage comparison, or may receive the second reference voltage +Vref2 from an external source. The first voltage comparison unit 200a may output a first comparison logic value to the control unit 300.

A non-inverting terminal (+) of the second comparator COMP2a may be connected to the first node N1, and an inverting terminal (−) of the second comparator COMP2a may be connected to a terminal that supplies the second reference voltage +Vref2. When the level of the voltage of the first node N1 is higher than that of the second reference voltage +Vref2, the second comparator COMP2a may output the first comparison logic value as 1. When the level of the voltage of the first node N1 is lower than that of the second reference voltage +Vref2, the second comparator COMP2a may output the first comparison logic value as 0.

The non-inverting terminal (+) of the second comparator COMP2a may be connected to the first node N1 through the first comparison switch SWCa. For example, when the first comparison switch SWCa is short-circuited, the non-inverting terminal (+) of the second comparator COMP2a may be connected to the first node N1. When the first comparison switch SWCa is opened, the non-inverting terminal (+) of the second comparator COMP2a may be floated. The first voltage comparison unit 200a may short-circuit the first comparison switch SWCa between a time when an output logic value corresponding to one bit of an N-bit digital output digital code is determined through one successive approximation cycle and a time when a next successive approximation cycle starts.

For the other time, the first voltage comparison unit 200a may open the first comparison switch SWCa.

For example, at a time when one output logic value is determined through one successive approximation cycle, the first voltage comparison unit 200a may generate the first comparison logic value using the voltage of the first node N1, which is used to determine a corresponding output logic value. Therefore, at a time when the successive approximation conversion unit 100 determines the output logic value, the first voltage comparison unit 200a may output the first comparison logic value, corresponding to the output logic value, to the control unit 300.

The second voltage comparison unit 200b includes a third comparator COMP2b and a second comparison switch SWCb. The second voltage comparison unit 200b may include a voltage source that generates a third reference voltage −Vref2, which is a reference for voltage comparison, or may receive the third reference voltage −Vref2 from an external source. The second voltage comparison unit 200b may output a second comparison logic value to the control unit 300.

An inverting terminal (−) of the third comparator COMP2b may be connected to a terminal that supplies the third reference voltage −Vref2, and a non-inverting terminal (+) of the third comparator COMP2b may be connected to the first node N1. When the level of the voltage of the first node N1 is higher than that of the third reference voltage −Vref2, the third comparator COMP2b may output the second comparison logic value as 0. When the level of the voltage of the first node N1 is lower than that of the third reference voltage −Vref2, the third comparator COMP2b may output the second comparison logic value as 1.

The inverting terminal (−) of the third comparator COMP2b may be connected to the first node N1 through the second comparison switch SWCb. For example, when the second comparison switch SWCb is short-circuited, the inverting terminal (−) of the third comparator COMP2b may be connected to the first node N1. When the second comparison switch SWCb is opened, the inverting terminal (−) of the third comparator COMP2b may be floated.

The second voltage comparison unit 200b may short-circuit the second comparison switch SWCb between a time when an output logic value corresponding to one bit of an N-bit digital output digital code is determined through one successive approximation cycle and a time when a next successive approximation cycle starts. For the other time, the second voltage comparison unit 200b may open the second comparison switch SWCb.

For example, at a time when one output logic value is determined through one successive approximation cycle, the second voltage comparison unit 200b may generate the second comparison logic value using the voltage of the first node N1, which is used to determine a corresponding output logic value. Therefore, at a time when the successive approximation conversion unit 100 determines the output logic value, the second voltage comparison unit 200b may output the second comparison logic value, corresponding to the output logic value, to the control unit 300.

The second reference voltage +Vref2 and the third reference voltage −Vref2 may have levels that are equal and have opposite polarities. For example, when the second reference voltage is a voltage that has a level of Vref2 and has a positive value, the third reference voltage is a voltage that has a level of Vref3 and has a negative value.

In this case, the certain condition may be whether the first and second comparison logic values are 1 or whether the first and second comparison logic values are 0. Also, each of the level of the second reference voltage +Vref2 and the level of the third reference voltage −Vref2 may correspond to a level equal to or a little lower than the level of a voltage corresponding to a minimum grayscale value of the N-bit output digital code. For example, since the level of the voltage of the first node N1 is very low, the certain condition may be satisfied when a difference between the level of the voltage of the first node N1 and a level of the ground is very small.

When the certain condition is satisfied and the output logic value is 0, the control unit 300 may determine, as 1, a value of a bit corresponding to a current output logic value among bits of the N-bit output digital code. The control unit 300 may determine, as 0, all values of bits lower than a corresponding bit. As a result, when the value of a current bit is determined as 1, instead of 0, due to a fine difference of a level of the analog input voltage, the control unit 300 may determine, as 0, all bits lower than a corresponding bit. Thus, the analog-to-digital conversion operation is quickly completed in a state where an error of an output digital value is relatively small.

Also, when the certain condition is satisfied and the output logic value is 1, the control unit 300 may determine, as 0, a value of a bit corresponding to a current output logic value among bits of the N-bit output digital code, and may determine, as 1, all values of bits lower than a corresponding bit. As a result, when a value of a current bit is determined as 0, instead of 1, due to a fine difference of a level of the analog input voltage, the control unit 300 may determine, as 1, all bits lower than a corresponding bit. Thus, the analog-to-digital conversion operation is quickly completed in a state where the error of the output digital value is relatively small.

Figure 5:
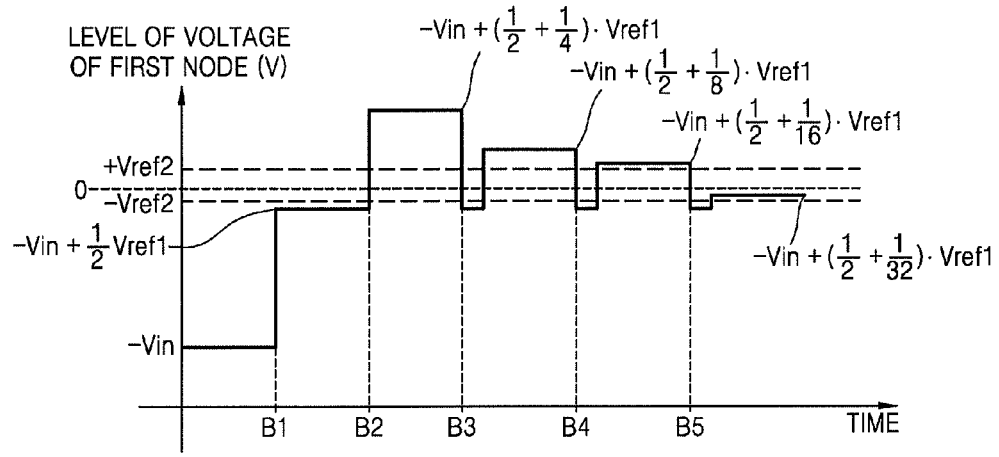
FIG. 5 illustrates an embodiment for acquiring an output digital code.

FIG. 5 is a timing diagram illustrating an embodiment for acquiring an output digital code with the ADC of FIG. 4. Referring to FIG. 5, the ADC of FIG. 4 may compare the level of the voltage of the first node N1 with the ground level (0), the level of the second reference voltage +Vref2, and/or the level of the third reference voltage −Vref2, and acquire an output digital code from an analog input signal.

First, the ADC of FIG. 4 may perform a sampling and holding operation to change the level of the voltage of the first node N1 to an inversion value (e.g., −Vin) of the analog input signal, before a first time B1.

Subsequently, the ADC may change the level of the voltage of the first node N1 to a level expressed based on Equation (1) at the first time B1.

Between the first time B1 and a second time B2, the ADC may compare the level of the voltage of the first node N1 with the ground level (0), the level of the second reference voltage +Vref2, and the level of the third reference voltage −Vref2, and determine an output logic value and a comparison logic value. For example, between the first time B1 and the second time B2, the level of the voltage of the first node N1 is lower than the ground level (0). Thus, the output logic value may be 0.

Also, between the first time B1 and the second time B2, the level of the voltage of the first node N1 is lower than the level of the second reference voltage +Vref2. Thus, the first comparison logic value may be 0.

Also, between the first time B1 and the second time B2, the level of the voltage of the first node N1 is lower than the level of the third reference voltage −Vref2. Thus, the second comparison logic value may be 1.

As a result, the control unit 300 may determine an MSB of an N-bit output digital code as 1. Also, the control unit 300 may connect the redistribution switch SW1, connected to the capacitive element C1 corresponding to the MSB, to the second node N2 as-is.

Also, since a condition where all the first and second comparison logic values are 1 is not satisfied and a condition where all the first and second comparison logic values are 0 is not satisfied, the control unit 300 may continuously perform the analog-to-digital conversion operation based on the successive approximation method.

Subsequently, at the second time B2, the ADC may change the level of the voltage of the first node N1 to a level expressed as Equation (2).

$$-Vin + \left(\frac{1}{2} + \frac{1}{4}\right) \times Vref1 \tag{2}$$

Between the second time B2 and a third time B3, the ADC of FIG. 4 may compare the level of the voltage of the first node N1 with the ground level (0), the level of the second reference voltage +Vref2, and the level of the third reference voltage −Vref2, and may determine an output logic value and a comparison logic value.

For example, between the second time B2 and the third time B3, the level of the voltage of the first node N1 is higher than the ground level (0). Thus, the output logic value may be 1.

Also, between the second time B2 and the third time B3, the level of the voltage of the first node N1 is higher than the level of the second reference voltage +Vref2. Thus, the first comparison logic value may be 1.

Also, between the second time B2 and the third time B3, the level of the voltage of the first node N1 is higher than the level of the third reference voltage −Vref2. Thus, the second comparison logic value may be 0.

As a result, the control unit 300 may determine a second significant bit of the N-bit output digital code as 0.

Also, the control unit 300 may connect the redistribution switch SW2, connected to the capacitive element C2 corresponding to the second significant bit, to the ground as-is. Therefore, capacitances of capacitors may be redistributed, and at the third time B3, the level of the voltage of the first node N1 may be changed to the level based on Equation (1).

Also, since a condition where all the first and second comparison logic values are 1 is not satisfied and a condition where all the first and second comparison logic values are 0 is not satisfied, the control unit 300 may continuously perform the analog-to-digital conversion operation based on the successive approximation method.

Subsequently, after a certain time elapses from the third time B3, the ADC may change the level of the voltage of the first node N1 to a level expressed in Equation (3).

$$-Vin + \left(\frac{1}{2} + \frac{1}{8}\right) \times Vref1 \tag{3}$$

Between the third time B3 and a fourth time B4, the ADC of FIG. 4 may compare the level of the voltage of the first node N1 with the ground level (0), the level of the second reference voltage +Vref2, and the level of the third reference voltage −Vref2, and may determine an output logic value and a comparison logic value.

For example, between the third time B3 and the fourth time B4, the level of the voltage of the first node N1 is higher than the ground level (0). Thus, the output logic value may be 1.

Also, between the third time B3 and the fourth time B4, the level of the voltage of the first node N1 is higher than the level of the second reference voltage +Vref2. Thus, the first comparison logic value may be 1.

Also, between the third time B3 and the fourth time B4, the level of the voltage of the first node N1 is higher than the level of the third reference voltage −Vref2. Thus, the second comparison logic value may be 0.

As a result, the control unit 300 may determine, as 0, a third bit from the MSB of the N-bit output digital code.

Also, the control unit 300 may connect the redistribution switch SW3, connected to the capacitive element C3 corresponding to the third bit, to the ground. Therefore, capacitances of capacitors may be redistributed, and at the fourth time B4, the level of the voltage of the first node N1 may be changed to the level based on Equation (1).

Also, since a condition where all the first and second comparison logic values are 1 is not satisfied and a condition where all the first and second comparison logic values are 0 is not satisfied, the control unit 300 may continuously perform the analog-to-digital conversion operation based on the successive approximation method.

Subsequently, after a certain time elapses from the fourth time B4, the ADC may change the level of the voltage of the first node N1 to a level expressed in Equation (4).

$$-Vin + \left(\frac{1}{2} + \frac{1}{16}\right) \times Vref1 \tag{4}$$

Between the fourth time B4 and a fifth time B5, the ADC of FIG. 4 may compare the level of the voltage of the first node N1 with the ground level (0), the level of the second reference voltage +Vref2, and the level of the third reference voltage −Vref2, and may determine an output logic value and a comparison logic value.

For example, between the fourth time B4 and the fifth time B5, the level of the voltage of the first node N1 is higher than the ground level (0). Thus, the output logic value may be 1.

Also, between the fourth time B4 and the fifth time B5, the level of the voltage of the first node N1 is higher than the level of the second reference voltage +Vref2. Thus, the first comparison logic value may be 1.

Also, between the fourth time B4 and the fifth time B5, the level of the voltage of the first node N1 is higher than the level of the third reference voltage −Vref2. Thus, the second comparison logic value may be 0.

As a result, the control unit 300 may determine, as 0, a fourth bit from the MSB of the N-bit output digital code.

Also, the control unit 300 may connect the redistribution switch SW4, connected to the capacitive element C4 corresponding to the fourth bit, to the ground. Therefore, capacitances of capacitors may be redistributed, and at the fifth time B5, the level of the voltage of the first node N1 may be changed to the level based on Equation (1).

Also, since a condition where all the first and second comparison logic values are 1 is not satisfied and a condition where all the first and second comparison logic values are 0 is not satisfied, the control unit 300 may continuously perform the analog-to-digital conversion operation based on the successive approximation method.

Subsequently, after a certain time elapses from the fifth time B5, the ADC may change the level of the voltage of the first node N1 to a level expressed in Equation (5).

$$-Vin + \left(\frac{1}{2} + \frac{1}{32}\right) \times Vref1 \tag{5}$$

After the fifth time B5 elapses, the ADC of FIG. 4 may compare the level of the voltage of the first node N1 with the ground level (0), the level of the second reference voltage +Vref2, and the level of the third reference voltage −Vref2, and may determine an output logic value and a comparison logic value.

For example, after the fifth time B5 elapses, the level of the voltage of the first node N1 is lower than the ground level (0). Thus, the output logic value may be 0.

Also, after the fifth time B5 elapses, the level of the voltage of the first node N1 is lower than the level of the second reference voltage +Vref2. Thus, the first comparison logic value may be 0.

Also, after the fifth time B5 elapses, the level of the voltage of the first node N1 is higher than the level of the third reference voltage −Vref2. Thus, the second comparison logic value may be 0.

As a result, the control unit 300 may determine, as 1, a fifth bit from the MSB of the N-bit output digital code. Also, the control unit 300 may connect the redistribution switch SW4, connected to the capacitive element C4 corresponding to the fifth bit, to the second node N2 as-is.

Also, since a condition where all the first and second comparison logic values are 0 is satisfied, the control unit 300 may terminate the analog-to-digital conversion operation based on the successive approximation method, and determine, as 1, all bit values of a sixth bit from the MSB to an LSB of an output digital code.

For example, when N is ten, an output digital code may be 1000100000, and when N is eight, an output digital code may be 10001000. Thus, an N-time successive approximation cycle is used to determine an N-bit output digital code using the successive approximation register ADC. According to an exemplary embodiment, an N-bit output digital code having no error is determined via an N-time or less successive approximation cycle.

Figure 6:
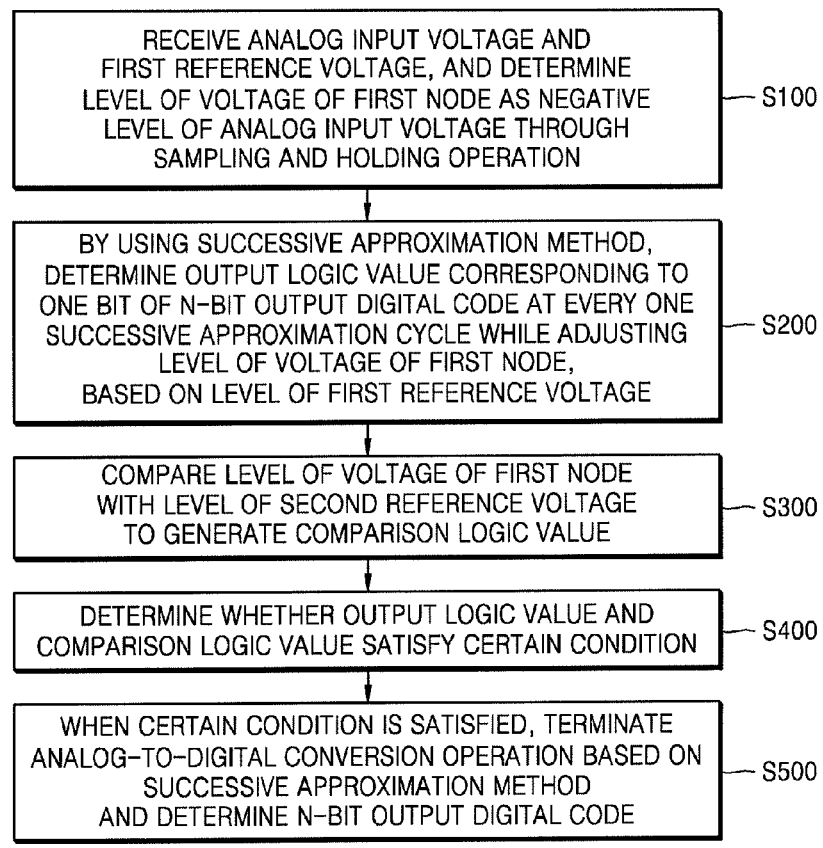
FIG. 6 illustrates an embodiment of an analog-to-digital converting method.

FIG. 6 illustrates an embodiment of an analog-to-digital converting method. Referring to FIG. 6, in operation S100, the method includes receiving an analog input voltage and a first reference voltage and determining the level of a voltage of a first node as a negative level of the analog input voltage through a sampling and holding operation.

In operation S200, using the successive approximation method, the output logic value corresponding to one bit of an N-bit output digital code is determined at every one successive approximation cycle, while adjusting the level of the voltage of the first node, based on a level of a first reference voltage.

In operation S300, the level of the voltage of the first node is compared with the level of a second reference voltage to generate a comparison logic value.

In operation S400, a determination is made as to whether the output logic value and the comparison logic value satisfy a certain condition. When the certain condition is satisfied, the method includes terminating an analog-to-digital conversion operation based on the successive approximation method and determining the N-bit output digital code in operation S500.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The comparison units, successive approximation conversion units, control units, and other processing features of the disclosed embodiments may be implemented in logic which, for example, may include hardware, software, or both. When implemented at least partially in hardware, the comparison units, successive approximation conversion units, control units, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the comparison units, successive approximation conversion units, control units, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments described herein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. An analog-to-digital converter (ADC), comprising:
a converter to receive an analog input voltage and a first reference voltage, to determine a level of a voltage of a first node as a negative level of the analog input voltage through a sampling and holding operation, and to determine output logic values repeating a plurality of successive approximation cycles, each output logic value corresponding to a respective bit of an N-bit output digital code to be determined for each of a plurality of the successive approximation cycles, the level of the voltage of the first node to be adjusted based on a level of the first reference voltage during the successive approximation cycles;

a voltage comparator to compare the level of the voltage of the first node with a level of a second reference voltage to generate a comparison logic value; and a controller to terminate an analog-to-digital conversion operation based on the successive approximation cycles and to determine the N-bit output digital code when the output logic value or the comparison logic value satisfies a certain condition.

2. The ADC as claimed in claim 1, wherein:

when the level of the voltage of the first node has a positive value, the output logic value is determined as 1, when the level of the voltage of the first node has a negative value, the output logic value is determined as 0, when the level of the voltage of the first node is higher than the level of the second reference voltage, the comparison logic value is determined as 1, and when the level of the voltage of the first node is lower than the level of the second reference voltage, the comparison logic value is determined as 0.

3. The ADC as claimed in claim 2, wherein the certain condition includes at least one of:

the comparison logic value is 1 when the output logic value is 0, or the comparison logic value is 0 when the output logic value is 1.

4. The ADC as claimed in claim 3, wherein:

when the output logic value is 0, the controller is to determine a value of a bit corresponding to the output logic value as 1, when the output logic value is 1, the controller is to determine the value of the bit corresponding to the output logic value as 0, when the certain condition is satisfied when the output logic value is 0 and the comparison logic value is 1, the controller is to determine, as 0, all values of bits lower than the bit corresponding to the output logic value among digital values of the N-bit output digital code, and when the certain condition is satisfied when the output logic value is 1 and the comparison logic value is 0, the controller is to determine, as 1, all the values of the bits lower than the bit corresponding to the output logic value among the digital values of the N-bit output digital code.

5. The ADC as claimed in claim 1, further comprising:

a switch to electrically connect the voltage comparator to the first node, wherein the switch is to be short-circuited between a time when the output logic value corresponding to one bit of the N-bit digital output digital code is determined through one successive approximation cycle and a time when a next successive approximation cycle starts.

6. The ADC as claimed in claim 1, wherein the voltage comparator includes:

a first voltage comparator to compare the level of the voltage of the first node with the level of the second reference voltage to generate a first comparison logic value; and a second voltage comparator to compare the level of the voltage of the first node with a level of a third reference voltage to generate a second comparison logic value.

7. The ADC as claimed in claim 6, wherein the second reference voltage and the third reference voltage have substantially equal levels and opposite polarities.

8. The ADC as claimed in claim 6, wherein:

when the level of the voltage of the first node has a positive value, the output logic value is determined as 1, when the level of the voltage of the first node has a negative value, the output logic value is determined as 0, when the level of the voltage of the first node is higher than the level of the second reference voltage, the first voltage comparator is to determine the first comparison logic value as 1, when the level of the voltage of the first node is lower than the level of the second reference voltage, the first voltage comparator is to determine the first comparison logic value as 0, when the level of the voltage of the first node is higher than the level of the third reference voltage, the second voltage comparator is to determine the second comparison logic value as 0, and when the level of the voltage of the first node is lower than the level of the third reference voltage, the second voltage comparator is to determine the second comparison logic value as 1.

9. The ADC as claimed in claim 8, wherein the certain condition includes:

the first and second comparison logic values are 1, or all the first and second comparison logic values are 0.

10. The ADC as claimed in claim 9, wherein:

when the output logic value is 0, the controller is to determine a value of a bit, corresponding to the output logic value as 1, when the output logic value is 1, the controller is to determine the value of the bit, corresponding to the output logic value, as 0, when the certain condition is satisfied and the output logic value is 0, the controller is to determine, as 0, all values of bits lower than the bit corresponding to the output logic value among digital values of the N-bit output digital code, and when the certain condition is satisfied and the output logic value is 1, the controller is to determine, as 1, all the values of the bits lower than the bit corresponding to the output logic value among the digital values of the N-bit output digital code.

11. The ADC as claimed in claim 6, further comprising:

a first switch to connect the first voltage comparator to the first node; and a second switch to connect the second voltage comparator to the first node, wherein the first and second switches are to be short-circuited between a time when the output logic value corresponding to one bit of the N-bit digital output digital code is determined through one successive approximation cycle and a time when a next successive approximation cycle starts.

12. An analog-to-digital converting method, the method comprising:

receiving an analog input voltage and a first reference voltage, determining a level of a voltage of a first node as a negative level of the analog input voltage through a sampling and holding operation;

determining output logic values corresponding to respective bits of an N-bit output digital code, each output logic value determined during one of a plurality of successive approximation cycles using a successive approximation method while adjusting the level of the voltage of the first node based on a level of the first reference voltage;

comparing the level of the voltage of the first node with a level of a second reference voltage to generate a comparison logic value;

determining whether the output logic value and the comparison logic value satisfy a certain condition; and when the certain condition is satisfied, terminating an analog-to-digital conversion operation and determining the N-bit output digital code.

13. The method as claimed in claim 12, wherein determining the output logic value includes:

when the level of the voltage of the first node has a positive value, determining the output logic value as 1;

when the level of the voltage of the first node has a negative value, determining the output logic value as 0;

when the level of the voltage of the first node is higher than the level of the second reference voltage, determining the comparison logic value as 1; and when the level of the voltage of the first node is lower than the level of the second reference voltage, determining the comparison logic value as 0.

14. The method as claimed in claim 13, wherein the certain condition includes at least one of:

the comparison logic value is 1 when the output logic value is 0, or the comparison logic value is 0 when the output logic value is 1.

15. The converting method as claimed in claim 14, wherein determining the output digital code includes:

when the output logic value is 0, determining a value of a bit, corresponding to the output logic value, as 1;

when the output logic value is 1, determining the value of the bit, corresponding to the output logic value, as 0;

when the certain condition is satisfied as a case in which the output logic value is 0 and the comparison logic value is 1, determining, as 0, all values of bits lower than the bit corresponding to the output logic value among digital values of the N-bit output digital code; and when the certain condition is satisfied as a case in which the output logic value is 1 and the comparison logic value is 0, determining, as 1, all the values of the bits lower than the bit corresponding to the output logic value among the digital values of the N-bit output digital code.

16. The method as claimed in claim 12, wherein generating the comparison logic value includes:

comparing the level of the voltage of the first node with the level of the second reference voltage to generate a first comparison logic value; and comparing the level of the voltage of the first node with a level of a third reference voltage to generate a second comparison logic value.

17. The method as claimed in claim 16, wherein the second reference voltage and the third reference voltage have substantially equal levels and opposite polarities.

18. The method as claimed in claim 16, wherein determining the output logic value includes:

when the level of the voltage of the first node has a positive value, determining the output logic value as 1;

when the level of the voltage of the first node has a negative value, determining the output logic value as 0;

when the level of the voltage of the first node is higher than the level of the second reference voltage, determining the first comparison logic value as 1;

when the level of the voltage of the first node is lower than the level of the second reference voltage, determining the first comparison logic value as 0;

when the level of the voltage of the first node is higher than the level of the third reference voltage, determining the second comparison logic value as 0; and when the level of the voltage of the first node is lower than the level of the third reference voltage, determining the second comparison logic value as 1.

19. The method as claimed in claim 18, wherein the certain condition includes:

the first and second comparison logic values are 1, or the first and second comparison logic values are 0.

20. The method as claimed in claim 19, wherein determining the output digital code includes:

when the output logic value is 0, determining a value of a bit, corresponding to the output logic value, as 1;

when the output logic value is 1, determining the value of the bit, corresponding to the output logic value, as 0;

when the certain condition is satisfied and the output logic value is 0, determining, as 0, all values of bits lower than the bit corresponding to the output logic value among digital values of the N-bit output digital code; and when the certain condition is satisfied and the output logic value is 1, determining, as 1, all the values of the bits lower than the bit corresponding to the output logic value among the digital values of the N-bit output digital code.

21. The ADC as claimed in claim 1, wherein the the N-bit output digital code is to control operation of an electronic apparatus.

* * * * *